INVENTORS
BRUCE I. BERTELSEN
ARNOLD E. REIMER
BY W S Robertson
ATTORNEY

Nov. 4, 1969 B. I. BERTELSEN ET AL 3,476,561

PHOTOETCH METHOD

Filed Aug. 30, 1965 2 Sheets-Sheet 2

3,476,561
PHOTOETCH METHOD

Bruce I. Bertelsen, Poughkeepsie, and Arnold E. Reimer, Carmel, N.Y., assignors to International Business Machines Corporation, Armonk, N.Y., a corporation of New York Filed Aug. 30, 1965, Ser. No. 483,698
Int. Cl. G03c *5/00*; C23f *1/02*
U.S. Cl. 96—36 1 Claim

ABSTRACT OF THE DISCLOSURE

This invention is a process of eliminating hole and island defects occurring in photoresists by a dual exposure and development of two substrates coated with two layers of positive photoresist to form intermediate patterns with reduced hole defects followed by a dual exposure and development of the etching subject which is coated wtih two layers of negative photoresist by each of said intermediate patterns to reduce island defects followed by an etching step.

INTRODUCTION

In many etching methods a surface of a subject to be etched is coated with an etch resistant material that is then removed where the subject is to be etched. In photoetching, the etch resistant coating (called a resist) is photosensitive. After a resist has been exposed to an image, the exposed areas (or the unexposed areas, depending on the resist type) can be removed in a developing step. Resists can be formed in patterns that have very small details, and the photographic techniques used in exposing the resists are convenient for forming small images from patterns that are initially made much larger. As an example, photoetching is useful in etching a very thin metal film to form an array of magnetic elements for a magnetic memory. This invention is particularly directed to problems that occur in etching very thin subjects and subjects in which the detail that is to be preserved is about the size of pinholes that form where the resist should protect the subject from the etchant and the size of small islands of resist that remain where the subject is to be etched.

Small dust particles on the surface of a resist when it is being exposed can cause corresponding holes or islands to appear in the resist and in the subject when it is etched. The same effects may occur with dust on the pattern that the image is made from, on the photographic apparatus, or in the air. Pinholes in the pattern can cause islands or pinholes in the resist. In a typical photoetch method there are several steps in which a new pattern is made from a preceding pattern, and each of these steps tends to carry over the islands and holes of the preceding pattern and to introduce new ones. In addition, the resist material may contain dust that allows the etchant to form a pinhole in the subject, and sharp irregularities in the surface of the subject can form pinholes in the resist. Furthermore, the resists and patterns can be scratched or otherwise damaged in handling. These defects can ruin a complex etched assembly; as an example, very small pinholes in a thin film magnetic element can destroy the intended magnetic characteristics of the element.

The prior art has suggested dyeing the resist so that pinholes can be distinguished visually. In the manufacturing area technicians check individual etched assemblies through a microscope and touch up the resist coating by hand, an operation that is tedious and costly. To reduce the amount of touch-up work, the prior art has also suggested costly procedures for keeping the manufacturing area dust free.

A general object of this invention is to provide a new photoetch method that better preserves details that might otherwise be obscured by the dust and pinholes and similar effects. A more specific object is to provide a new and improved photoetch method that avoids pinholes in a very thin subject such as a thin film memory element. Another general object of this invention is to provide a new and improved photoetch method in which substantially all of the etched subjects are free of defects associated with dust or pinholes. Another general object of the invention is to provide a new and improved photoetching method that can be performed in a level of dust associated with relatively simple cleaning procedures. Another more specific object of this invention is to prevent the effects of dust and similar factors from building up from pattern to pattern. Another more specific object is to correct for inherent defects in the negative or positive patterns used in a photoetch method.

In the method of this invention selected steps are duplicated and between such duplicate steps the associated apparatus and patterns are cleaned. A fairly simple cleaning operation is effective to rearrange the random position of dust on the subject and apparatus and to lower the level of dust sufficiently so that dust and other defects are not likely to appear at the same point in each of the duplicate steps. The duplicate steps are arranged so that the random defects in one duplicate step tend to be corrected by the other duplicate step.

In a form of the method that will be described in detail, two or more resists are formed on the material to be etched and between exposures the apparatus is suitably cleaned to rearrange the random position of dust. Thus the random holes in one resist tend to be covered by the other resist. The two resists are exposed according to duplicate patterns that are also made to have different arrangements of random holes and islands. Thus at each step in the method the effect of dust can be reduced.

The description of the preferred form of the method will incidentally explain more fully the prior art method that has been mentioned in this introduction. This more specific background will help in understanding the goals and other features of the invention that have been introduced so far.

The foregoing and other objects, features and advantages of the invention will be apparent from the following more particular description of a preferred embodiment of the invention, as illustrated in the accompanying drawings.

THE DRAWING

INTRODUCTION TO THE INVENTION

Figure 1:
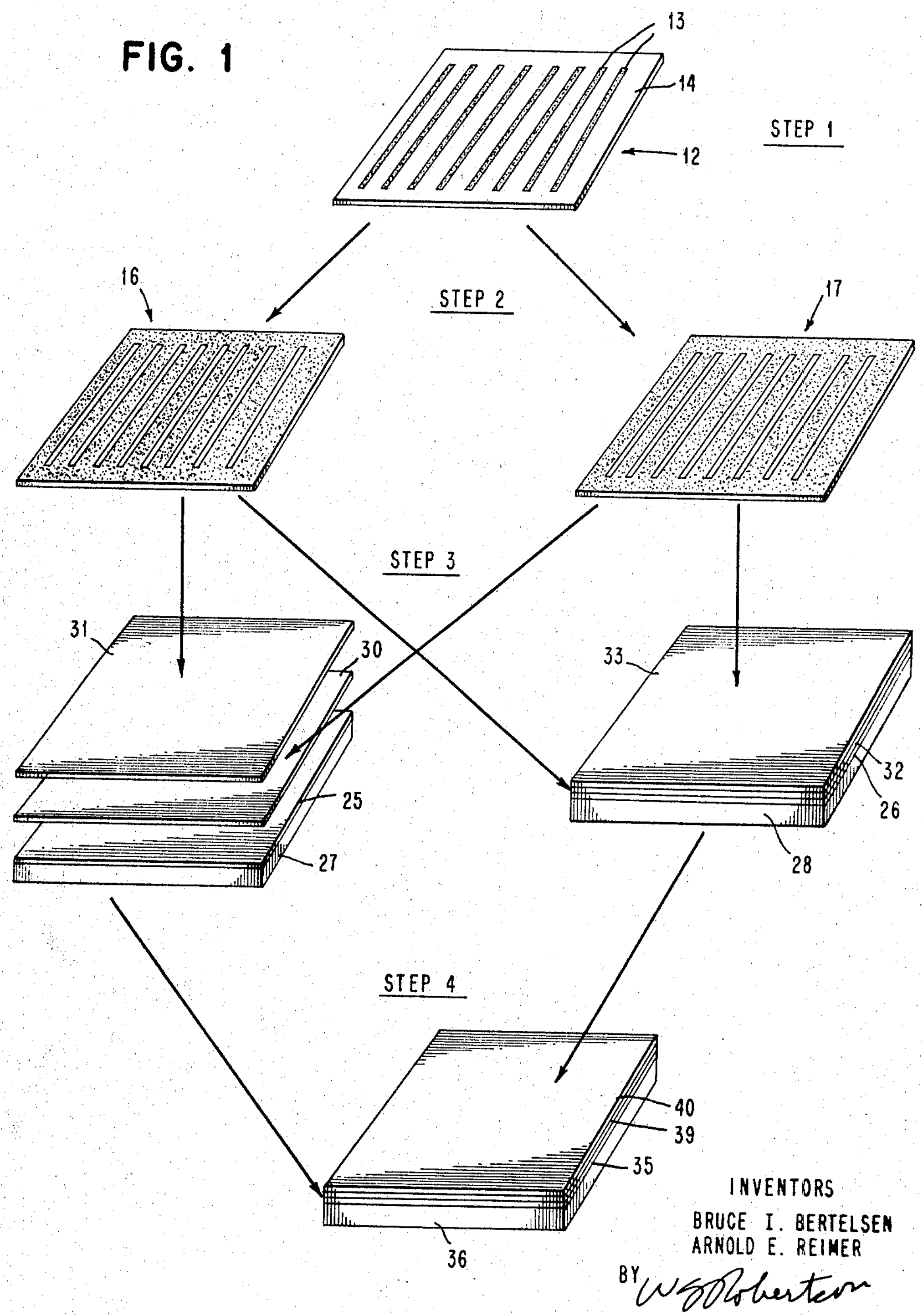
FIG. 1 is an isometric of a subject to be etched and some of the apparatus used in etching with arrows showing the sequence in which these elements appear in the steps of the method of this invention.

In this part of the description the specific form of the method illustrated in FIG. 1 will be outlined step by step. This explanation will primarily identify features that are similar to prior art methods. The features that are directed to overcoming the problems of dust and other factors will be introduced here and described in detail later.

In step 1 a pattern 12, called artwork, is hand drawn by a draftsman. The dark portion of pattern 12 represents a system of conductive lines 13 that will be formed when the subject is etched away in the regions 14 where pattern 12 is light. Lines 13 illustrate problems that occur in photoetching any geometric pattern. Pattern 12 can be formed with lines 13 light and lines 14 dark with appropriate modifications to subsequent steps.

From a more general standpoint, pattern 12 is a means to define areas of the subject that are to be etched and areas that are not to be etched, the light and dark areas are binary values at defined points in the pattern, and the pattern can be formed and represented in any suitable way. In the method of FIG. 1 and in many prior art methods a succession of patterns is produced. Pattern 12 is characterized by the fact that it is the first of these patterns, and the goal of the invention is to reproduce the artwork faithfully on the etched subject as though the artwork itself has no errors. To distinguish such a pattern from subsequent patterns, it can be called a first pattern.

Typically, artwork has a second characteristic that it is not directly usable in the optical systems that expose a resist. This is not inherently true of first patterns, and artwork and other first patterns with this characteristic will be called an optically nonusable pattern.

In step 2 pattern 12 is photographed to form a negative transparency that can be used directly in an optical system to form an image of pattern 12. For generality, an intermediate pattern formed from an optically nonusable first pattern will be called a first intermediate pattern. According to this invention, at least two such first intermediate patterns 16, 17 may be formed. The apparatus for forming the negatives is suitably cleaned before each negative is formed. This cleaning process does not need to be so elaborate to remove all the dust but it is effective to rearrange the random position of dust and to keep the dust level low enough that there is an acceptably low likelihood that dust will appear at an identical point in each negative.

Step 3 is an optional but frequently desirable step in which a metal pattern is made from the negative by photoetching techniques. A metal pattern is more durable than negative 16 or 17 and is preferable if the same pattern is to be used many times. In the method of FIG. 1, two or more such metal patterns are formed. The metal pattern comprises a plate 25 or 26 of metal formed on a suitable glass support 27 or 28. More generally the metal is an etchable, durable, and opaque material and the glass is a transparent, mechanically stable, and suitably etch resistant material.

Each plate 25, 26 is given two resists 30 and 31 or 32 and 33. As the arrows in FIG. 1 represent, each resist is exposed to one of the two negatives. As is conventional, a resist is formed on the surface of the material to be etched, the surface of the resist is cleaned and exposed to the image of negative 16 or 17, and the resist is developed to remove regions when the exposure establishes that the metal plate 25 or 26 is to be etched. The resists can be developed separately or together. Many prior art methods and materials for forming two resists and developing the image are suitable in the method of this invention.

The metal pattern 25 or 26 is itself an end result of a photoetch method and can be called a subject. Where the metal pattern is to be considered as an intermediate step in the photoetching method, it can be called a second intermediate pattern.

In step 4, the pattern is applied to a subject 35 that is formed on a suitable support 36. According to this invention, the subject is given two resists 39, 40 in generally the same way as in step 3 and each resist is exposed according to one of the two metal patterns in generally the same way that resists 30, 31 and 32, 33 are exposed to negatives 16, 17 in step 3.

As the introductory explanation shows, a photoetching method typically has a succession of patterns. At each step where a new pattern is formed, any errors in the preceding patterns tend to be carried over and new errors can be introduced. The next section will explain in detail how these errors may occur and how the duplicate steps of the method of FIG. 1 reduce the errors.

THE PROBLEM OF DUST AND SIMILAR FACTORS

Figure 2:
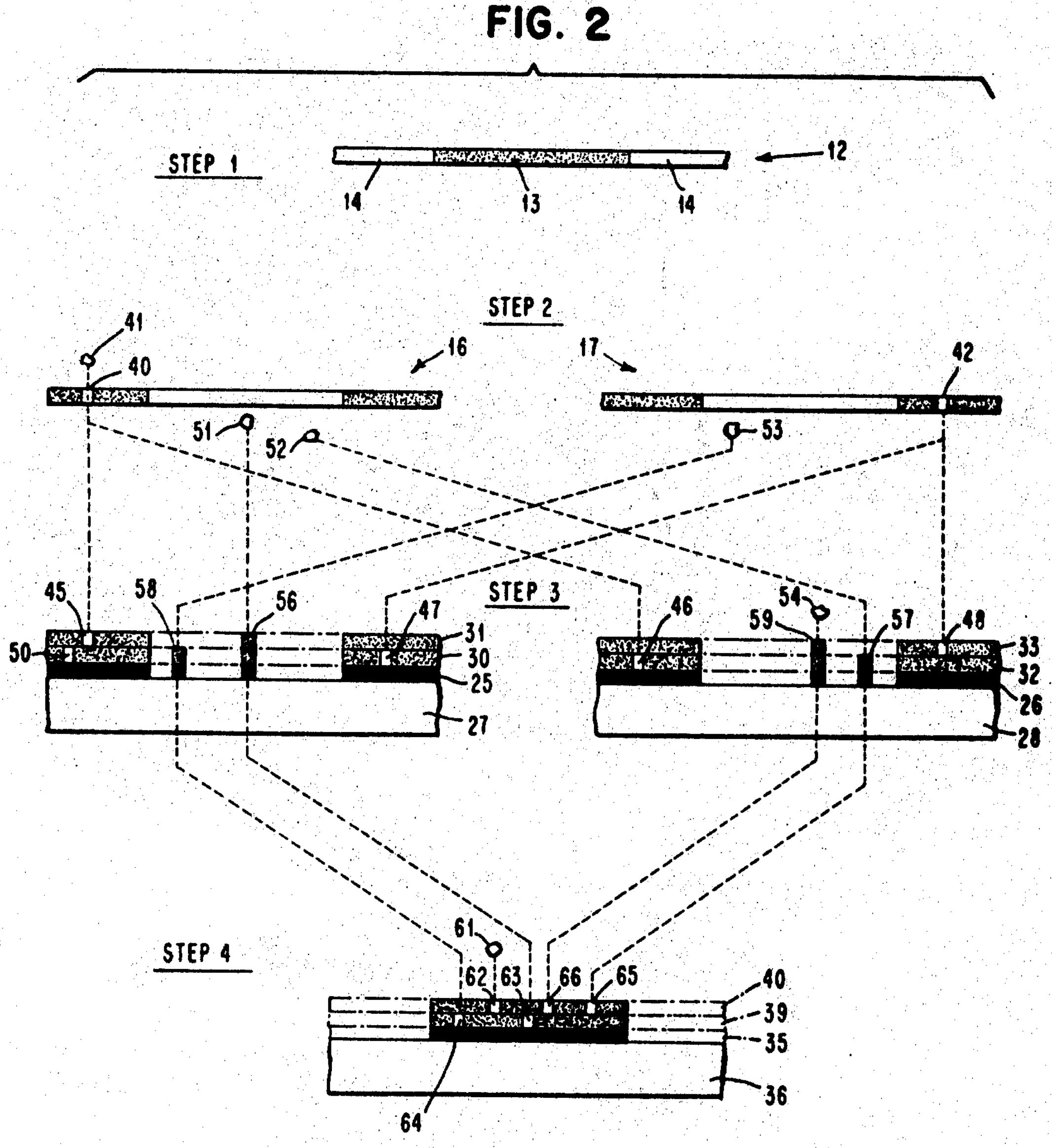
FIG. 2 is a schematic end view of a portion of each of the elements of FIG. 1 showing how extraneous effects are cancelled or accumulated from step to step.

FIG. 2 shows schematically a section of each of the elements of FIG. 1 in the region of a single line 13 and neighboring background 14. Dust particles and pinholes are drawn in critical areas of the photosensitive negatives and coatings. Dashed lines show how defects carry through from step to step until they are corrected. (Uncorrectable defects will be discussed later.)

Negative 16 has an illustrative transparent point 40 associated with a dust particle 41 that prevents the negative from being exposed to the corresponding light region 14 in pattern 12. Negative 17 has a pinhole 42 in a region that was exposed and should have become opaque. From a more general standpoint, hole 40 is caused by a factor associated with the environment and is reorientable as well as random; hole 42 is associated with the pattern media and is random but not reorientable. (As has already been explained, pattern 12 does not introduce recognizable defects into step 2; to look ahead in the explanation, patterns 16, 17, 25 and 26 present defects that are not reorientable and in some cases may not be random.) Environmental factors ordinarily block the transmission of light; media factors can have the same effect as light that is blocked or as a point of light in a region that should not be exposed.

The effect of points 40 and 42 is identical and such light transmitting points will be called holes without regard to their cause. It is significant in the method that both environmental factors and media factors can be made to produce the same effect in an intermediate pattern (and in the subject resists 35, 36). It is much more difficult to correct the pattern if both holes and islands appear to a significant extent in the same pattern.

The resist used in step 3 is illustrated as positive in its response to light. That is, regions exposed to light are removed by developing. Thus hole 41 in negative 16 causes a hole 45 in resist 31 and an identically located hole 46 in resist 32. Hole 42 similarly causes holes 47 and 48 in resists 30 and 33. In addition, holes such as 50 in resist 30 may occur because the resist contains dust or for other reasons. As FIG. 2 shows, these holes appear at random and independent points in adjacent resists 30, 31 and 32, 33 and there are few enough holes that there is an acceptably small likelihood that any of the holes will be aligned and thereby expose metal plates 25 or 26. (The effect of aligned holes on subject 35 will be explained later.)

Illustrative dust particles 51, 52, 53 and 54 further interfere with exposing the resists in step 3. Because the resists are positive, dust causes small islands of resist to form and these islands lead to corresponding islands of metal in patterns 25, 26. Before a resist is exposed, the negative, the resist and the associated apparatus are cleaned. Thus, although dust particle 51 produces an island 56 in resist 31 and plate 25, it does not remain to produce an identically located island in resist 32 and plate 26. Similarly, dust particle 52 produces an island 57 when resist 32 is exposed to negative 16; dust particle 53 produces an island 58 in plate 25 when resist 30 is exposed to negative 17; and particle 54 produces an island 59 in plate 26 when resist 33 is exposed to negative 17.

In step 4 a negative resist is used. Thus dust particle 61 produces a hole 62 in resist layer 40 which is covered by an intact portion of layer 39. Islands 56 and 58 in plate 25 produce holes 63 and 64 in coating 39 and islands 57 and 59 produce holes 65 and 66 in layer 40. Because islands 56, 58 in plate 25 are located independently of islands 57, 59 in plate 26, the corresponding holes in step 5 tend to be not aligned.

Thus in the final step each defect is eliminated even though in some steps the resists have both holes and islands and in some cases defects carry over from one step to another.

OTHER EMBODIMENTS

It will be helpful to generalize the specific method of FIG. 2. The fact that two resists 39 and 40 are used in the final step gives the method the ability to suppress the effect of random holes (if there are not too many). For full advantage of this ability, the photoresist type (positive or negative) should be selected to cause the most significant environmental factor (here, dust) to appear as a hole. For the same reason, the pattern of the preceding step (25, 26) should be a positive or a negative as appropriate to make the most significant defect in that pattern appear as islands or holes, whichever will lead to holes in a coating of the final step.

It is further preferable in the next to the last step to use two photosensitive layers so that in the final step the subject will not be exposed to a pattern having both holes and islands. For a specific example, if plate 25 in step 3 is considered to be the subject, it will be preferable in the preceding step 2 to superimpose negatives 16, 17 to cover random holes 40, 42 or to make a double exposure to eliminate the effect of dust particles 51, 53. In the first example coatings 30, 31 would be negative to form holes in response to dust, and patterns 16, 17 would be positive rather than negative. (It is a significant feature of the method of FIG. 2 that it uses only single exposure of individual negatives.)

As a further generalization, in a step that involves duplicate single layer patterns (step 2), the most significant defects that cannot be reoriented by cleaning (here holes 40, 42) are preferably made to form holes in the next step. This is because holes can be eliminated in this next step but islands cannot be eliminated until the second next step when they can be made to form unaligned holes. To keep the islands unaligned in this next step they must be made to correspond only to random reorientable points. Specifically, with a negative photoresist in step 3, holes in the negatives 16, 17 would produce aligned islands in plates 25, 26 which would appear as holes in subject 35.

So far the invention has been illustrated with the condition that the double coatings do not have aligned holes. Aligned holes in resists 39 and 40 of step 4 would produce a hole in subject 35. Aligned holes in resists 30 and 31 or 32 and 33 of step 4 would produce a hole in plate 25 or 26 and an island in subject 35. Holes may also occur in plates 25, 26 because of defects in the plates that are independent of the resists. In some applications it may be preferable to reduce the number of holes in the final coating by causing some of the defects to appear as islands instead of holes. In an etched array of thin film magnetic bits for example, a hole can destroy a bit but islands are not particularly troublesome. Thus, for example, if a positive resist is used in step 4, the dust associated with step 4 would form islands in the resist and the subject; these islands may be preferable to the additional holes that such dust particles would form when a negative resist is used in the last step.

With some material it is possible to make one resist layer positive and the other negative. With two different resist types, aligned holes or islands in the two preceding patterns will appear as islands rather than as holes.

Thus the specific form of the method shown in the drawing can be modified to correct for a variety of extraneous conditions and to achieve a relationship between the number of holes and the number of islands that is most appropriate for a particular application. It is also possible to use a single pattern in either step 2 or step 3 if these patterns can be kept acceptably free from defects.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. In a photoetch method of the type in which the subject to be etched in coated with two layers of photoresist and exposed in separate steps to two separate intermediate patterns, a method of eliminating both hole and island type defects comprising:

(a) coating two substrate portions with a first layer of positive resist;

(b) exposing this first layer of the positive resist on each substrate portion through a mask in producing each of the intermediate patterns;

(c) recoating both substrate portions with a second layer of positive resist;

(d) exposing this second layer of positive resist on each substrate portion through a mask in a step separate from the first mentioned exposing step in producing each of the intermediate patterns;

(e) developing said layers of positive resist and removing exposed portions thereof to define both said separate intermediate patterns;

(f) coating the subject to be etched with a first layer of negative resist;

(g) exposing this first layer of negative resist through one of the intermediate patterns;

(h) recoating the subject to be etched with a second layer of negative resist;

(i) exposing this second layer of negative resist through the other of the intermediate patterns in a step separate from the exposing of said first negative layer;

(j) developing said layers of negative resist and removing unexposed portions thereof; and (k) etching the subject with the remaining negative resist thereon to produce the desired pattern.

References Cited

UNITED STATES PATENTS 3,317,320 1/1964 Reber ............... 96—362

GEORGE F. LESMES, Primary Examiner

R. F. MARTIN, Assistant Examiner

U.S. Cl. X.R.

96—36.2; 156—11